United States Patent [19]
Gedridge, Jr.

[11] Patent Number: 5,346,852
[45] Date of Patent: Sep. 13, 1994

[54] LOW TEMPERATURE PROCESS FOR PRODUCING INDIUM-CONTAINING SEMICONDUCTOR MATERIALS

[75] Inventor: Robert W. Gedridge, Jr., Ridgecrest, Calif.

[73] Assignee: The United States of America as represented by the Secretary of the Navy, Washington, D.C.

[21] Appl. No.: 27,314

[22] Filed: Feb. 25, 1993

[51] Int. Cl.$^5$ .................. H01L 21/20; C23C 16/00
[52] U.S. Cl. ...................... 437/104; 437/126; 427/255.2; 427/255.1; 427/255; 427/314; 148/DIG. 65
[58] Field of Search .......... 427/255.2, 255.1, 255, 427/248.1, 314; 148/DIG. 65; 437/104, 126

[56] References Cited

U.S. PATENT DOCUMENTS 4,533,410  8/1985  Ogura et al. .................. 148/175
5,213,654  5/1993  Sasaki et al. .................. 156/614

FOREIGN PATENT DOCUMENTS 63-199415  8/1988  Japan.

OTHER PUBLICATIONS

Chen et al, "Triisopropylindium for OMVPE Growth," Journal of Crystal Growth 124 (1992) pp. 88–92.

Primary Examiner—Roy V. King
Attorney, Agent, or Firm—Stuart H. Nissim; Melvin J. Sliwka; John L. Forrest, Jr.

[57] ABSTRACT

Chemical vapor deposition process for producing indium-containing semiconductor materials, particularly III/V indium-containing semiconductor materials, using triisopropylindium as the source of indium. In the process a flow of triisopropylindium and a flow of a group V source or precursor, e.g. AsH$_3$, are directed into a reactor in contact with a heated substrate. The triisopropylindium and group V precursor are at least partially decomposed, depositing by chemical vapor deposition an indium-containing III/V semiconductor material on the substrate. The result is lower pyrolysis temperatures and less carbon impurity incorporation into the indium-containing semiconductor material than when commercially available indium sources are used.

17 Claims, No Drawings

LOW TEMPERATURE PROCESS FOR PRODUCING INDIUM-CONTAINING SEMICONDUCTOR MATERIALS

BACKGROUND OF THE INVENTION

The present invention relates to a low temperature chemical vapor deposition process for producing indium-containing semiconductor materials employing triisopropylindium as the source of indium.

Indium containing semiconductor materials have been grown by organometallic vapor phase epitaxy (OMVPE) using conventional organoindium precursors such as trimethylindium, triethylindium, ethyldimethylindium and cyclopentadienylindium. The most common OMVPE indium precursor presently employed is trimethylindium. However, there are several problems associated with the use of trimethylindium. Since trimethylindium is a solid at or below room temperature, the effective vapor pressure of trimethylindium in a bubbler changes with time due to changes in the surface area of solid. This results in transport problems in a OMVPE system. Since trimethylindium decomposes slowly at temperatures lower than 400° C. in an atmospheric reactor, semiconductor film growth below 400° C. is typically inefficient because trimethylindium is too stable at these low film growth temperatures. Furthermore, the use of trimethylindium in low temperature film growth can result in significant unintentional carbon impurity incorporation—due to the formation of methyl radicals during pyrolysis—which can be deleterious to the performance of a semiconductor device.

Additionally, the incorporation of Bi into InAs, useful for far infrared device applications, requires growth temperatures as low as 275° C. At this low growth temperature, trimethylindium decomposition is not complete so the growth rates of InAs and InAsBi are too low.

While ethyldimethylindium is a liquid, its relative compositional stability as a pure molecular compound is questionable. Furthermore, ethyldimethylindium is too stable for low temperature film growth and its use can also result in unintentional carbon incorporation due to the formation of methyl radicals during pyrolysis. Although triethylindium is a liquid, it has been reported to be marginally stable and has been observed to decompose in the "bottle" during storage. Furthermore, triethylindium undergoes parasitic reactions with Group V hydrides such as $AsH_3$ and $PH_3$ to form nonvolatile adducts upstream of the substrate in the atmospheric pressure OMVPE reactors. Cyclopentadienylindium is a solid with a vapor pressure an order of magnitude less than trimethylindium and appears to be thermally more stable than trimethylindium which rules out its use for low temperature film growth of indium-containing semiconductor materials.

Therefore, there is a need for an alternative organoindium precursor without methyl groups or substituents that result in unintentional carbon incorporation for the low temperature chemical vapor deposition of indium-containing semiconductor materials. The availability of alternative chemical vapor deposition organoindium precursors with lower pyrolysis temperatures and lower carbon incorporation characteristics would greatly enhance the development of indium containing semiconductor materials and devices.

One object of the present invention is the provision of an improved process for forming indium-containing semiconductor materials using chemical vapor deposition.

Another object is to provide such process employing an indium precursor with a lower pyrolysis temperature than organoindium precursors heretofore used.

Still another object is the employment in the above process of an indium precursor that is more efficiently pyrolyzed at lower film growth temperatures than organoindium precursors heretofore used.

A still further object is to provide a process of the above type employing an organoindium precursor that results in less unintentional carbon impurity incorporation at lower film growth temperatures than with the use of conventional organoindium precursors such as trimethylindium and ethyldimethylindium precursors.

Another object is the provision of an improved indium-containing semiconductor material obtained by the invention process.

Other objects and advantages of the invention will appear hereinafter.

SUMMARY OF THE INVENTION

The above objects are achieved according to the invention and a low temperature efficient chemical vapor deposition process for forming an indium-containing semiconductor material, by employing the indium precursor, triisopropylindium, $((CH_3)_2CH)_3In$. The advantages of using triisopropylindium are that it is a liquid with a freezing point less than $-78°$ C.; it has a useful vapor pressure in chemical vapor deposition systems; and, it pyrolyzes at lower temperatures than conventional organoindium precursors with reduced carbon impurity incorporation.

The process can be used in forming III/V indium-containing semiconductor materials by chemical vapor deposition, as described in greater detail hereinafter. In such a process a flow of two or more source compounds, one of which is triisopropylindium, at least one other being a source of a Group V material, is directed toward a heated substrate in a reactor. The triisopropylindium and the source of Group V material from such directed flow are decomposed, depositing an indium-containing III/V semiconductor material on the substrate.

DETAILED DESCRIPTION OF THE INVENTION AND PREFERRED EMBODIMENTS

Triisopropylindium, $((CH_3)_2CH)_3In$, can be prepared by reaction of anhydrous $InCl_3$ with an isopropyl Grignard in an ethereal solvent free of water and oxygen. The reaction is as follows:

$$InCl_3 + 3((CH_3)_2CH)MgX \rightarrow ((CH_2)_2CH)_3In + 3MgX_2$$

where X is a halide.

A variety of water- and oxygen-free ethereal solvents can be used in the above reaction, for example, diethyl ether, dipropyl ether, and dibutyl ether. While only theoretical proportions of 3 equivalents of the isopropyl Grignard per equivalent of $InCl_3$ is required, in preferred practice an excess of the Grignard, e.g. 3.5 equivalents, is used, since the Grignard may not be completely pure. The reaction is conveniently carried out at ambient temperature and pressure. Following the reaction, solvent is removed by vacuum distillation, and the residue is extracted with a saturated alkane, e.g. pentane or hexane, to extract the triisopropylindium and separate the salts. Such salts are removed by filtration, and the remaining solvent is removed to obtain the desired triisopropylindium product.

The following is an example of preparation of triisopropylindium:

EXAMPLE 1

Organic solvents were distilled under Ar from sodium/benzophenone. Synthesis was carried out under purified Ar using inert atmosphere techniques. Reaction flasks were wrapped in aluminum foil to minimize exposure to light. Triisopropylindium, $((CH_3)_2CH)_3In$, was synthesized by reaction of anhydrous $InCl_3$ (99.999% metal basis, Alfa Chemical) with 3.5 equivalents of isopropylmagnesium chloride (Aldrich Chemical) in diethyl ether at ambient temperature and pressure. The diethyl ether was removed under vacuum at room temperature and the residue was extracted with hexane. After filtration, the solvents were removed by fractional vacuum distillation and the crude product was collected in a liquid nitrogen trap. The light-yellow liquid was then heated to 75° C. and refluxed at 3 torr using a $-13°$ C. condenser for 4 hours in the dark to remove any traces of solvent. The product was then purified by fractional vacuum distillation two more times (60° C. at 2.0 torr and 53° C. at 1.2 torr) to yield an air-, heat-, and light-sensitive light-yellow pyrophoric liquid in 50–55% yield. The desired compound was confirmed by $^1H$ and $^{13}C$ NMR spectroscopy.

Triisopropylindium, $((CH_3)_2CH)_3In$, can be used as a low temperature, alternative precursor to the chemical vapor deposition growth of indium-containing semiconductor materials.

The decomposition of triisopropylindium and trimethylindium was studied in a flow tube apparatus, using He as the carrier gas with the pyrolysis products monitored by a mass spectrometer. From the decomposition data, it was found that these organoindium precursors pyrolyze primarily by a gas phase homolytic fission of the In-C bonds to form free radicals. Triisopropylindium is 50% decomposed at about 110° C. using He as the carrier gas. This is about 200° C. lower than that for trimethylindium under similar conditions. Lower decomposition temperatures of triisopropylindium in comparison to trimethylindium is a significant improvement for low temperature chemical vapor deposition of indium-containing semiconductor materials.

The lower decomposition temperature of triisopropylindium in comparison to trimethylindium not only permits lower film growth temperatures, but also provides a source compound for indium whose pyrolysis is significantly more efficient at higher growth temperatures. Use of triisopropylindium results in significantly less carbon incorporation into the semiconductor materials grown at low temperatures, in comparison to trimethylindium, since methyl radicals do not originate during the pyrolysis of triisopropylindium.

Indium-containing III/V semiconductor materials can be binary (2-element), ternary (3-element) or quaternary (4-element) semiconductor materials, wherein one element is the Group III element indium, In, and at least one other element is a group V element, more specifically N, P, As, Sb and Bi. While triisopropylindium is the source material for indium in the chemical vapor deposition process of the invention, exemplary source materials for the group V element are $AsH_3$, $(t-Bu)AsH_2$, $PH_3$, $(t-Bu)PH_2$, $(CH_3)_3Sb$, $(CH_3)_3Bi$, $NH_3$, and $(t-Bu)NH_2$. Other source materials for the group V element can be employed.

Examples of binary III/V indium-containing semiconductor compounds produced according to the chemical vapor deposition process of the invention are as follows:

InSb
InP
InBi
InN
InAs

Examples of ternary III/V indium-containing semiconductors are as follows:

InAsBi
InAsSb
InSbBi
InAsP
InSbP

An example of a quaternary III/V indium-containing semiconductor produced by the invention process is InAsSbBi.

In carrying out the chemical vapor decomposition reaction according to the invention, a suitable reactor is provided containing a heated substrate, which can be any semiconductor substrate such as InAs, InP, InSb, Si, GaAs or GaP. A flow of the triisopropylindium and one or more source compounds of the Group V material or element, e.g. $AsH_3$, in a carrier gas is directed into the reactor toward the substrate. The temperature of the reactor is sufficiently high to at least partially decompose the triisopropylindium, thereby producing an In-containing semiconductor without substantial amounts of carbon deposits. However, generally the reaction is carried out at temperatures sufficiently high to at least partially decompose both the triisopropylindium and the Group V source precursor or precursors to deposit the desired In-containing semiconductor on the substrate. Thus, the reaction temperature in the reactor can range broadly from about 100° C. to about 700° C., usually between about 250° C. and about 500° C.

The chemical vapor deposition process hereof is independent of the pressure of the chemical vapor deposition reactor. Thus, the reactor can be operated at ambient pressure or at reduced pressure, e.g. down to about $10^{-9}$ torr. A substantial stoichiometric excess of Group V source material or materials can be employed in relation to triisopropylindium, depending on the particular Group V precursors used, temperature, pressure, and reactor geometry.

In carrying out the process, hydrogen or some other carrier gas, e.g. helium or nitrogen, is bubbled through liquid triisopropylindium in a container. The carrier gas transports the triisopropylindium in vapor phase into the reactor for chemical vapor deposition, e.g. OMVPE. Since triisopropylindium is a liquid whereas trimethylindium, now commercially used as the organoindium source, is a solid and presents problems with respect to transport of this material, triisopropylindium offers a substantial advantage in this respect. The vapor stream comes into contact with a heated substrate and decomposes to deposit In on the substrate.

In the case of producing, for example, a binary indium-containing semiconductor, such as InAs, two lines can be introduced into the reaction zone, each with a carrier gas saturated with a precursor of one of the two elements, one of which is triisopropylindium, the other a precursor of a group V element. Such gases contact the heated substrate and deposit the appropriate indium-containing semiconductor, which is substantially free of carbon impurities from the decomposition of the triisopropylindium.

The following is an example of practice according to the invention:

EXAMPLE 2

InAs epilayers were grown using organometallic vapor phase epitaxy on InAs and InP substrates. The OMVPE process was carried out at atmospheric pressure at temperature ranging from 260° C. to 500° C. in a horizontal OMVPE reactor using palladium-diffused $H_2$ as the carrier gas and $AsH_3$ as the As source and triisopropylindium as the In source. InAs epilayers were deposited and grown on the substrate at temperatures as low as 260° C. Typical flow rates for triisopropylindium were about 300 cc/min with the bubbler being held at about 22° C. The $AsH_3$ flow rate was on the order of 20 cc/min. The V/III molar ratios were between about 140 and 460. It was necessary to increase the V/III ratio as the growth temperature decreased due to the incomplete pyrolysis of $AsH_3$ at low temperatures. The use of triisopropylindium with $AsH_3$ resulted in significantly less carbon incorporation into the deposited InAs as determined by Secondary Ion Mass Spectrometry (SIMS) than with films grown with trimethylindium and $AsH_3$. The as-grown films were n-type.

From the foregoing, it is seen that the invention provides an improved process for producing indium-containing semiconductors employing triisopropylindium as the organoindium precursor which results in lower pyrolysis temperatures and lower carbon incorporation characteristics, thereby greatly enhancing the development of indium-containing semiconductor materials and devices. By using the improved process of the present invention, optoelectronic devices made with indium-containing semiconductor materials can be produced. The process of the present invention lowers the production costs and/or improves the performance of indium-containing semiconductor devices.

Since various modifications of the invention will occur to those skilled in the art, the invention is not to be taken as limited except by the scope of the appended claims.

What is claimed is:

1. In a process of forming an indium-containing semiconductor material by chemical vapor deposition the improvement comprising using triisopropylindium as a source of indium for film growth temperatures between 100° C. to less than or equal to 250° C.

2. The process of claim 1, including employing one or more sources of a Group V material, to produce a III/V indium-containing semiconductor material.

3. The process of claim 2, wherein said one or more sources of said Group V material is a compound containing an element selected from the group consisting of nitrogen, phosphorus, arsenic, antimony and bismuth.

4. The process of claim 3, wherein said III/V indium-containing semiconductor material is selected from the group consisting of binary, ternary and quaternary III/V indium-containing semiconductor materials.

5. The process of claim 2, employing arsine as a source of a Group V material, to produce an indium and arsenic-containing semiconductor material.

6. A process for forming III/V indium-containing semiconductor materials which comprises reacting triisopropylindium and one or more sources of a group V material by chemical vapor deposition at temperatures between 100° C. to less than or equal to 250° C. and depositing a III/V semiconductor material without substantial unintentional impurity incorporation.

7. The process of claim 6, wherein said one or more sources of said Group V material is a compound containing an element selected from the group consisting of nitrogen, phosphorus, arsenic, antimony and bismuth.

8. The process of claim 7, wherein said III/V indium-containing semiconductor material is selected from the group consisting of binary, ternary and quaternary III/V indium-containing semiconductor materials.

9. The process of claim 6, the reaction taking place from ambient pressure to low pressure down to $10^{-9}$ torr.

10. The process of claim 6, said source of a Group V material being arsine, and depositing the semiconductor InAs.

11. The process of claim 6, including depositing said III/V semiconductor material on a semiconductor substrate.

12. A process for forming III/V indium-containing semiconductor materials which comprises providing a carrier gas containing triisopropylindium and providing a carrier gas containing a source of a group V material, providing a reactor for chemical vapor deposition containing a substrate heated to between 100° C. to less than or equal to 250° C., passing said carrier gas containing triisopropylindium into said reactor, passing said carrier gas containing said source of a group V material into said reactor, heating said gases at said temperatures, and depositing an indium-containing III/V semiconductor on said substrate, said semiconductor being substantially free of unintentional impurities.

13. The process of claim 12, said substrate being a semiconductor.

14. The process of claim 12, wherein the pressure in said reactor ranges from ambient pressure to low pressure down to about $10^{-9}$ torr.

15. The process of claim 12, said substrate being heated to about atmospheric pressure.

16. The process of claim 12, said source of a Group V material being arsine.

17. The process of claim 16, said reactor being maintained at about ambient pressure, and employing a substantial excess of arsine in relation to triisopropylindium.

* * * * *